United States Patent [19]

Duesman

[11] Patent Number: 5,889,307
[45] Date of Patent: Mar. 30, 1999

[54] SACRIFICIAL DISCHARGE DEVICE

[75] Inventor: Kevin Duesman, Boise, Id.

[73] Assignee: Micron Technology, Inc., Boise, Id.

[21] Appl. No.: 638,838

[22] Filed: Apr. 29, 1996

[51] Int. Cl.⁶ .................................................. H01L 23/62
[52] U.S. Cl. ........................... 257/355; 257/288; 257/296
[58] Field of Search .................................... 257/288, 296, 257/355

[56] References Cited

U.S. PATENT DOCUMENTS

| | | | |
|---|---|---|---|
| 3,418,493 | 12/1968 | Uzunoglu et al. | 257/288 |
| 4,855,953 | 8/1989 | Tsukamoto et al. | 365/149 |
| 4,941,028 | 7/1990 | Chen et al. | 357/23.13 |

*Primary Examiner*—Olik Chaudhuri
*Assistant Examiner*—Douglas A. Wille
*Attorney, Agent, or Firm*—Fletcher, Yoder & Van Someren

[57] ABSTRACT

The process of semiconductor fabrication includes certain steps, such as plasma etching and ion implantation, that may cause a substantial charge to accumulate upon certain electrically isolated conductive or semiconductive elements formed upon the surface of a silicon wafer. One such element is the common plate of a dynamic random access memory (DRAM) array. When a substantial charge is accumulated upon such a common plate, dielectric breakdown may occur in one or more of the capacitive storage cells in the memory array. The discharge device disclosed herein is designed to catastrophically fail when such accumulated charge becomes excessive, thereby providing a discharge path for such accumulated charge. In this manner, the discharge device will be destroyed rather than the critical elements of the semiconductor device.

11 Claims, 3 Drawing Sheets

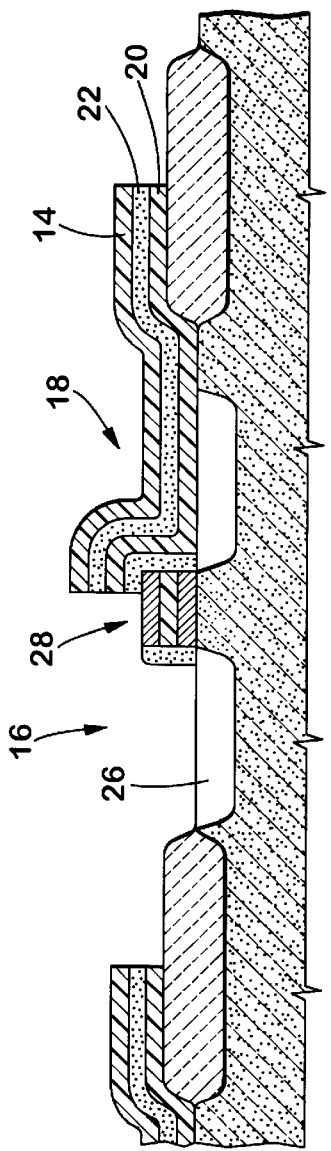
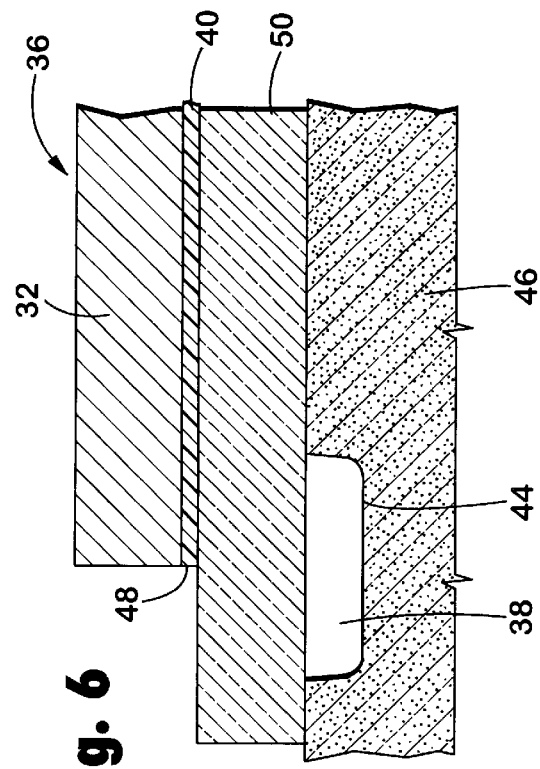
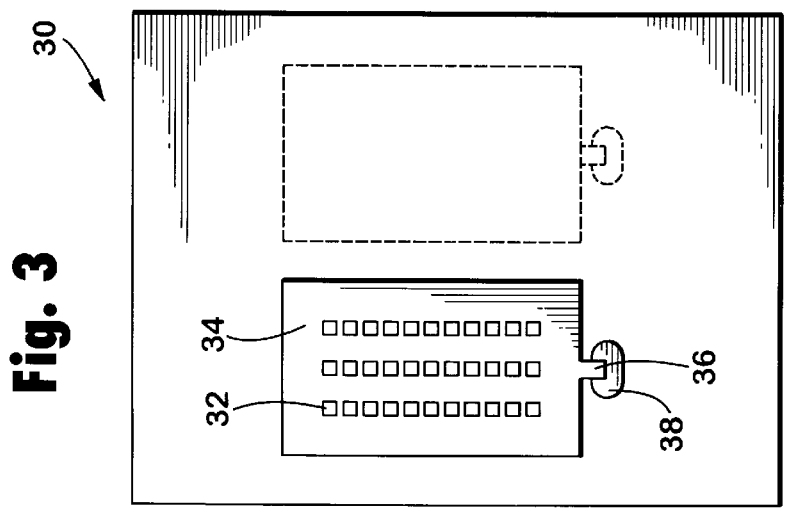

SACRIFICIAL DISCHARGE DEVICE

BACKGROUND OF THE INVENTION

1. Field of the Invention

The present invention relates generally to semiconductor devices and, more particularly, to a discharge device that, when a large electrical charge is accumulated thereupon during a semiconductor fabrication process, is designed to transfer the charge to prevent, or at least minimize, circuit element failures.

2. Description of the Related Art

The fabrication of a semiconductor device, such as a dynamic random access memory (DRAM), begins with a thin semiconductor wafer. Such semiconductor wafer may be subjected to numerous processing steps before a completed semiconductor device is created. Some of these processing steps, particularly those involving the use of an electric field such as plasma etching or ion implantation, may cause an unwanted electrical charge to accumulate on electrically isolated regions of charge accumulating material that have been formed upon the silicon wafer, i.e., those regions of conductive or semiconductive material having no electrically conductive coupling to the silicon wafer. Thus, a voltage may be established between such electrically isolated regions of charge accumulating material and the wafer itself. This can occur, for example, when the semiconductor wafer is electrically grounded during processing and the electrically isolated layers on the wafer have no path for releasing an accumulated charge to the ground potential of the wafer.

Problems may arise if such electrically isolated regions of charge accumulating material acquire a substantial charge during various processing stages. Such an accumulated charge could lead to the catastrophic breakdown of certain insulative elements, such as capacitor dielectrics, that are formed upon the silicon wafer. For example, the upper cell plate of a memory array within a DRAM device may serve as a common node for a large number of capacitive cells. Because of its relatively large size, this cell plate may develop a substantial charge, particularly during processes such as plasma etching, wherein a large amount of RF energy is applied to the wafer. If this accumulated charge is great enough, it may be dissipated through breakdown of the dielectric layer within one or more capacitors of the memory array. This could render the entire DRAM semiconductor device unusable, or at least require further processing to isolate damaged cells.

The problem of capacitive cell breakdown is exacerbated as the semiconductor industry utilizes increasingly thin oxide, nitride, and other insulative layers in an effort to make semiconductor devices more compact. Although capacitors are perhaps the subject of greatest concern because of the thin dielectric layers typically used to achieve high capacitance for a given capacitor size, insulator failure may be a problem with any device having an electrically isolated region of charge accumulating material separated from a semiconductor wafer by a thin layer of insulator material. Generally speaking, the thinner the layers of insulator material are, the more susceptible they are to breaking down.

The present invention is directed to overcoming, or at least minimizing, one or more of the problems set forth above.

SUMMARY OF THE INVENTION

In accordance with one aspect of the present invention, there is provided a discharge device for discharging an electrical charge from an electrically isolated layer of charge accumulating material that may accumulate during semiconductor fabrication process steps.

In accordance with another aspect of the present invention, there is provided a method of fabricating a semiconductor device upon a semiconductor wafer such that a breakdown region is created in a layer of insulator material formed upon the semiconductor wafer.

BRIEF DESCRIPTION OF THE DRAWINGS

Advantages of the invention will become apparent upon reading the following detailed description and upon reference to the drawings in which:

FIG. 2 is a cross-sectional view of a stacked capacitor in a DRAM memory cell.

FIG. 3 is a top view of a DRAM die having an electrically isolated layer of conductive material and containing the discharge device according to the present invention.

FIG. 6 is a cross-sectional view of a third embodiment of the discharge device illustrated in FIG. 3.

Figure 1A:
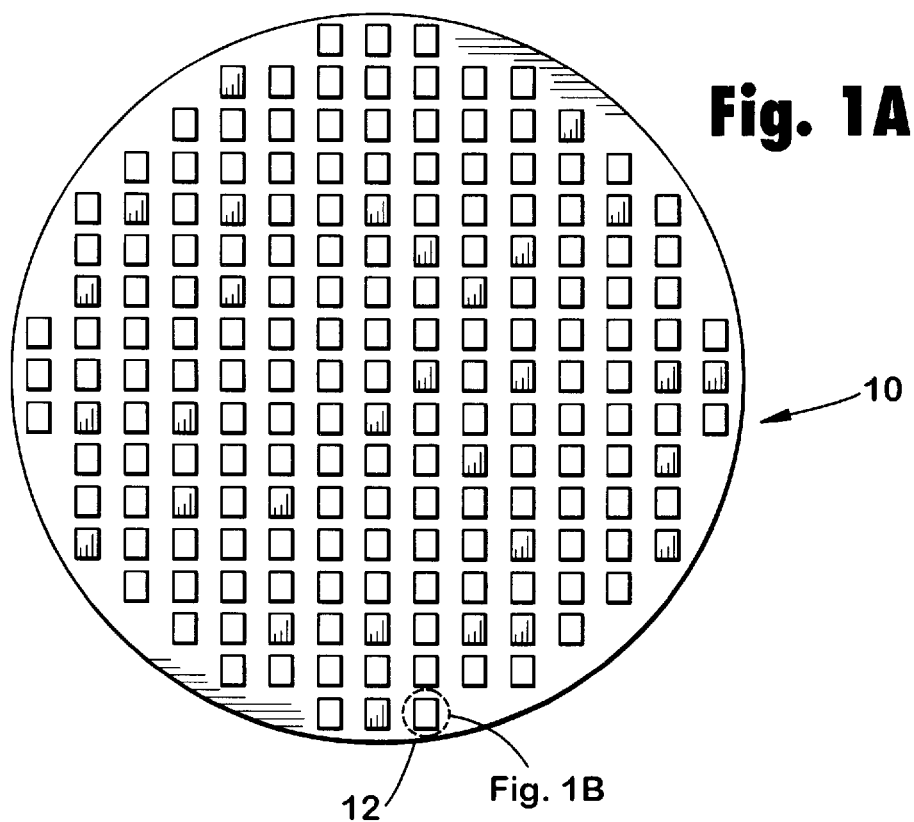
FIG. 1A is a top view of a silicon wafer with a plurality of semiconductor dies formed thereupon.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

Turning now to the drawings, a silicon wafer 10 having a plurality of semiconductor dies 12 formed thereupon is illustrated in FIG. 1A. Although, in this embodiment the wafer 10 is formed of silicon, it will be recognized that other types of semiconductive material, such as gallium arsenide, could also be used for the wafer 10. Each of the semiconductor dies 12 on the silicon wafer 10 will eventually become a semiconductor device such as a dynamic random access memory (DRAM), static random access memory (SRAM), microprocessor, etc. A DRAM has been chosen for purposes of illustration, but those skilled in the art will recognize that the described advantages may apply to other types of semiconductor devices as well.

Figure 1B:
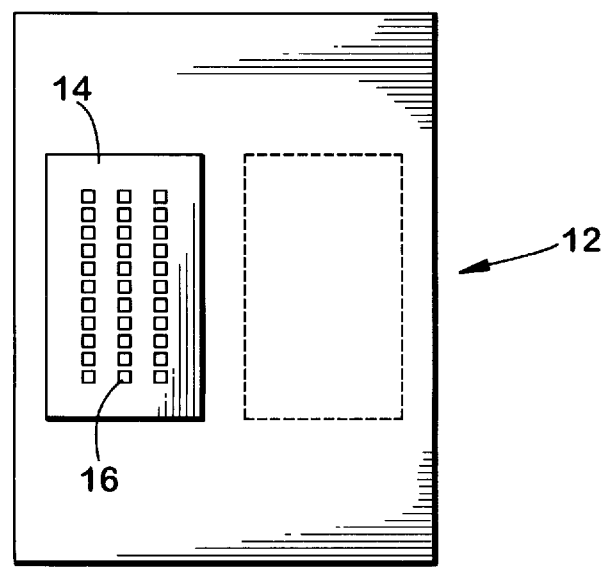
FIG. 1B is a top view of a portion of a DRAM die having a layer of conductive material formed thereupon.

An enlarged top view of a portion of a semiconductor die 12 for a DRAM is illustrated in FIG. 1B. Formed upon the semiconductor die 12 is a layer of material that serves as the common plate 14 of the DRAM memory array. As explained in detail below, this layer (common plate 14) is electrically isolated from the wafer's substrate by a thin layer of insulator material and, thus, accumulates electrical charge during processing of the wafer. Although typically formed of doped polysilicon, this layer of charge accumulating material could be formed of any conductive or semiconductive material on which an electrical charge may be accumulated.

FIG. 1B shows only one such electrically isolated layer or common plate 14 on this portion of the die 12, but there will likely be a plurality of such layers on a single die (as represented by the dashed outline in FIG. 1B). According to one embodiment, the common plates 14 of the DRAM memory array are formed from a single layer of doped polysilicon being 1000 to 2000 angstroms in thickness. This single layer of doped polysilicon is etched so that individual electrically isolated common plates 14 are formed within the same plane on the die 12, although these individual layers are electrically connected during later processing steps. Each such layer may serve as a common plate 14 for thousands of memory cells. It is on such electrically isolated layers of material that an electrical charge may accumulate during processing steps such as plasma etching or ion implantation.

In order to allow conductive lines, such as metallic contacts, to pass through the common plate 14, contact openings 16 are etched in the common plate 14. For purposes of illustration, the contact openings 16 shown in FIG. 1B are relatively few. In actuality, the number of contact openings 16 etched through the common plate 14 would number in the thousands, e.g., one for each memory cell in the array. An exemplary contact opening configuration is illustrated in FIG. 2, which shows a cross-sectional view of a single DRAM memory cell having a MOSFET transistor 28 and a stacked storage capacitor 18. A contact opening 16 is etched through the common plate 14 in a later processing step so that a metallic contact, serving as a bit line connection, can be formed to reach the N or P-type doped region 26 of the MOS transistor 28.

The storage capacitor 18 of FIG. 2 includes the common plate 14 and a storage plate 20 with a thin layer of insulator material operatively coupled therebetween. This thin layer of insulator material is typically a dielectric, such as oxide or nitride, and is therefore commonly referred to as the cell dielectric 22. The storage plate 20 is typically formed from a layer of doped polysilicon. Although all memory cells in the array share a common plate 14, each memory cell has its own individual storage plate 20. Thus, while the layer of doped polysilicon comprising the common plate 14 is contiguous over at least a portion of the array, the layer of doped polysilicon, from which the individual storage plates 20 are patterned, is not contiguous.

The cell dielectric 22 between the common plate 14 and the storage plate 20 is typically 90 to 130 angstroms in thickness, although dielectric layers in stacked capacitor storage cells continue to become thinner as DRAM sizes decrease. Because dielectric breakdown may occur on the order of one volt per 10 angstroms or even less, this layer of cell dielectric 22 may fail when the charge accumulated during processing creates a voltage between the common plate 14 and the storage plate 20 of 9 to 13 volts. Such voltages may be generated between the plates during fabrication processes, such as plasma etching and ion implantation, since a large electrical charge can accumulate on the common plate 14 during these procedures. Charge accumulation may occur because there is no discharge path for the common plate 14. For this reason, the cell dielectric 22 in one or more of the storage capacitors 18 of the DRAM memory array is at risk of failing catastrophically during fabrication. A dielectric failure of this type could render an entire DRAM device unusable, or at least require further processing to isolate damaged cells.

FIG. 3 illustrates an enlarged top view of a portion of a semiconductor die 30 for a DRAM similar to that shown in FIG. 1B, but including a sacrificial discharge device. Formed upon the semiconductor die 30 is an electrically isolated layer of charge accumulating material that serves as the common plate 32 of a DRAM memory array. This electrically isolated common plate 32 functions in the same manner as the common plate 14 described with reference to FIGS. 1B and 2, the only difference being that a small portion 36 of the common plate 32, extends outwardly from the array such that the small portion 36 is positioned over a doped region 38 in the silicon wafer 10. During processing, this doped region 38 serves as a discharge node through which to release an electrical charge that may accumulate on the common plate 32. During DRAM operation, the doped region 38 functions as an electrical buffer between the common plate 32, which is typically tied to Vcc/2 in a DRAM memory array, and the substrate of the silicon wafer 10, which is typically biased at a negative voltage relative to ground. The doped region 38 can be an N-well, active region, contact region, or any conductive region in the silicon wafer 10 created by ion implantation or diffusion processes, but should be formed deep enough within the silicon wafer 10 so that it will not be etched through during a subsequent process step.

Figure 4A:
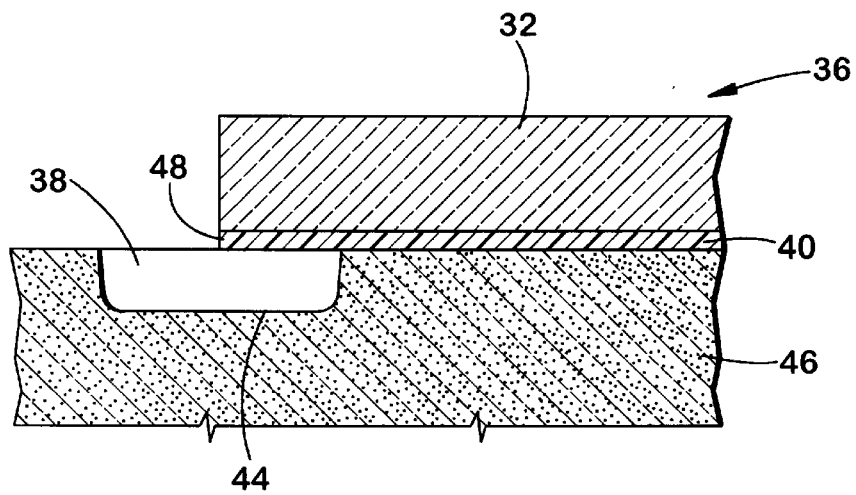
FIG. 4A is a cross-sectional view of a first embodiment of the discharge device illustrated in FIG. 3.

The positioning of the small portion 36 of the common plate 32 over the doped region 38 (discharge node) is further illustrated in FIG. 4A, which shows a cross-sectional view of a first embodiment of the discharge device. This embodiment comprises the electrically isolated common plate 32, a doped region 38 in a substrate portion 46 of the silicon wafer 10, and a thin layer of sacrificial insulator material 40 operatively coupled between the common plate 32 and the doped region 38.

The discharge device of this first embodiment may be built during fabrication of a DRAM memory array without the necessity of additional process steps. First, a doped region 38 is created within a substrate portion 46 of the silicon wafer 10. In a later process step, a thin layer of sacrificial insulator material 40 is formed on the surface of the substrate 46 so that it is operatively coupled to the doped region 38. Although, in this embodiment, the layer of sacrificial insulator 40 is formed of a dielectric material, such as nitride or oxide, another insulator, such as a ferroelectric material, could also be used. A dielectric material is used for the sacrificial insulator 40 in this embodiment because the sacrificial insulator 40 is formed during the same process steps and from the same layer of insulator material as the DRAM cell dielectrics 22. For this reason, the layer of sacrificial insulator 40 would be roughly 90 to 130 angstroms in thickness, i.e., the thickness of the cell dielectrics 22.

In another process step, a layer of doped polysilicon is formed so that it is operatively coupled to the sacrificial dielectric 40 and electrically isolated from the silicon wafer 10. It is from this electrically isolated layer of doped polysilicon that the common plate 32 can be formed during a subsequent etch step. It will be recognized that although the common plate 32 is typically formed of doped polysilicon, other types of charge accumulating, i.e., conductive or semiconductive, material could be used. During the subsequent etch step, the common plate 32 and the layer of sacrificial dielectric 40 over the doped region 38 may be etched so that a breakdown region 48 is created at the edge of the sacrificial insulator 40 between the common plate 32 and the doped region 38. This breakdown region 48 may be created by etching either entirely or partially through the layer of sacrificial insulator material 40.

FIG. 4A illustrates a breakdown region 48 formed by etching entirely through the layer of sacrificial insulator 40. In this manner, a breakdown region 48 is formed at the very edge of the sacrificial insulator 40, which tends to become electrically conductive because of the damage caused to, and the residue left on, the edge of the sacrificial insulator 40 during the etch process. In particular, the breakdown region 48 is formed to have a lower electrical breakdown threshold than the cell dielectrics 22 or other areas of insulator material within the DRAM that are meant to be protected.

Figure 4B:
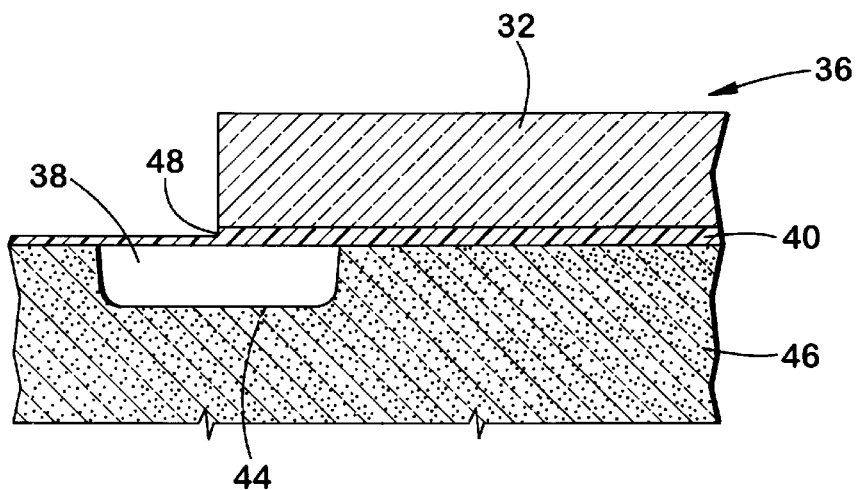
FIG. 4B is a cross-sectional view of a second embodiment of the discharge device illustrated in FIG. 3.

FIG. 4B illustrates a second embodiment having a breakdown region 48 formed by etching only partially through the layer of sacrificial insulator 40. Again, a breakdown region 48 is formed along the edge of the sacrificial insulator 40 due to the damage caused to this edge of the sacrificial insulator 40 during the etch process. However, because the layer of sacrificial insulator 40 is not etched entirely through in the second embodiment shown in FIG. 4B, this breakdown region 48 will likely have a greater electrical resistance than the breakdown region 48 of the first embodiment, shown in FIG. 4A, and will thus require a greater accumulated charge to cause an electrical breakdown.

An alternative method for creating a breakdown region 48 is by using for the layer of sacrificial insulator 40 a layer of insulator material having a lower electrical breakdown threshold than the layer of cell dielectric material 22 used within the stacked storage capacitors 18 of the DRAM memory array. It will be recognized that a layer of insulator material may have a lower electrical breakdown threshold because the insulator material itself is susceptible to breaking down (i.e., becoming electrically conductive) under an accumulated charge, or because the layer of insulator material is thinner than the cell dielectric 22 or other area of insulator material meant to be protected. These methods of forming a breakdown region 48, however, would require additional process steps, i.e., steps beyond those necessary to build the DRAM memory array, to form the discharge device. That is, the layer of sacrificial insulator 40 could not be formed during the same process steps and from the same layer of insulator material as the cell dielectrics 22.

The discharge devices illustrated in both FIG. 4A and FIG. 4B provide a discharge path for an electrical charge that may accumulate on the electrically isolated common plate 32 during processing. When the accumulated charge on the common plate 32 grows excessive, it creates an electrically conductive path across the breakdown region 48 of the sacrificial insulator 40. When this occurs, the accumulated charge will leak across this breakdown region 48 to the doped region 38 in the substrate portion 46 of the silicon wafer 10. The doped region 38 forms a junction 44 within the substrate portion 46 that functions, electrically, as a diode in series with a large resistance between the doped region 38 and the substrate portion 46. Because the silicon wafer 10 is generally grounded during processing, a current leakage path is thus provided between the common plate 32 and the silicon wafer 10. In this manner, the sacrificial insulator 40 is sacrificed at the breakdown region 48 so that the individual layers of cell dielectric 22 (FIG. 2) within each of the stacked capacitor storage cells 18 of the DRAM memory array will be spared. That is, the breakdown region 48 is designed to fail before the individual layers of cell dielectric material 22 in each of the stacked capacitors 18.

Figure 5:
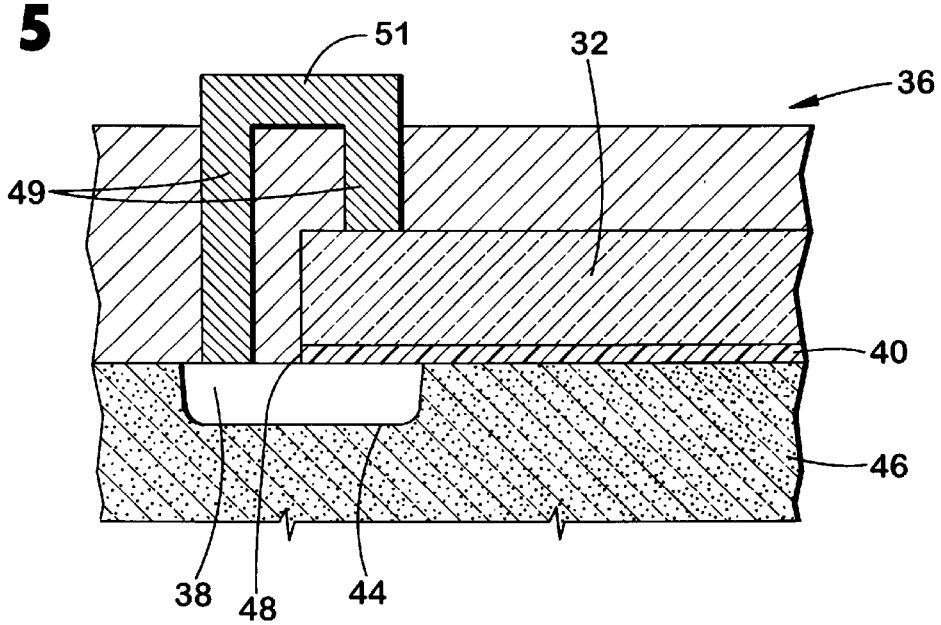
FIG. 5 is a cross-sectional view of the discharge device illustrated in FIG. 3 following additional fabrication process steps.

Following all processing steps in which a significant charge may be accumulated upon the common plate 32, an additional processing step can be implemented whereby the doped region 38 is electrically connected to the cell plate 32 with a metal contact or other conductive material so that the device is not left in a floating condition. One method of accomplishing this electrical connection is illustrated in FIG. 5, wherein metal contacts 49 are formed in contact with the doped region 38 and the common plate 32 and then connected via a metal line 51.

A cross-sectional view of a third embodiment is illustrated in FIG. 6. In this embodiment, the discharge device comprises an electrically isolated common plate 32, a doped region 38 in a substrate portion 46 of the silicon wafer 10, a region of charge carrying material 50, and a thin layer of sacrificial insulator material 40 operatively coupled between the common plate 32 and the region of charge carrying material 50. This embodiment may be formed during fabrication of a DRAM memory array without the necessity of additional process steps. First, a doped region 38 is created within a substrate portion 46 of the silicon wafer 10. In a later process step, a layer of doped polysilicon is formed on the surface of the substrate portion 46 so that it is electrically coupled to the doped region 38. This layer of doped polysilicon is subsequently etched to form the region of charge carrying material 50 positioned outside of the memory array and directly over the doped region 38. It will be recognized that although polysilicon is used in this embodiment, other conductive or semiconductive materials could be used to form the region of charge carrying material 50. The region of charge carrying material 50 need not have any specific dimensions, but it should be large enough to ensure a good electrical connection with the doped region 38. The storage cells 20 in each of the stacked capacitors 18 of the memory array can be formed during the same etch step and from the same layer of conductive or semiconductive material as the region of charge carrying material 50.

In a further process step, a thin layer of sacrificial insulator 40 is formed so that it is operatively coupled to the region of charge carrying material 50. Although, in this embodiment, the layer of sacrificial insulator 40 is formed of a dielectric material, such as nitride or oxide, another insulator, such as a ferroelectric material, could also be used. A dielectric material is used for the sacrificial insulator 40 in this embodiment because the sacrificial insulator 40 is formed during the same process step and from the same layer of insulator material as the DRAM cell dielectrics 22. In still another process step, an additional layer of doped polysilicon is formed so that it is operatively coupled to the layer of sacrificial insulator 40 and electrically isolated from the silicon wafer 10. It is from this additional layer of electrically isolated doped polysilicon that the common plate 32 can be formed during a subsequent etch step. Although, in this embodiment, the common plate 32 is formed of doped polysilicon, it will be recognized that the common plate 32 could be formed of another charge accumulating, i.e., conductive or semiconductive, material.

During the subsequent etch step, the common plate 32 and the layer of sacrificial insulator 40 over the doped region 38 may be etched so that a breakdown region 48 is created at the edge of the sacrificial insulator 40 between the common plate 32 and the region of charge carrying material 50. As previously described, this breakdown region 48 may be created by etching either partially or entirely through the layer of sacrificial insulator 40 or by using for the layer of sacrificial insulator 40 a layer of insulator material having a lower electrical breakdown threshold than the layer of cell dielectric material 22 used within the stacked storage capacitors 18 of the DRAM memory array.

A discharge path is created for an electrical charge that may accumulate on the electrically isolated common plate 32 during fabrication. If the accumulated charge becomes excessive, it will create an electrically conductive path across the breakdown region 48 of the sacrificial insulator 40. The accumulated charge is then able to travel across this breakdown region 48 and through the region of charge carrying material 50 to the doped region 38 in the substrate portion 46 of the silicon wafer 10. A current leakage path is thus provided between the electrically isolated common plate 32 and the silicon wafer 10. This operates in the same fashion as the first and second embodiments to protect the individual layers of cell dielectric material 22 in each of the stacked capacitors 18 of the DRAM memory array.

It will be recognized that one advantage of the discharge device of the present invention is that it can be fabricated during the standard process flow required to build, for example, the stack capacitors 18 of FIG. 2. For instance, the sacrificial insulator 40 is preferably formed at the same time and from the same material as the dielectric layer 22 of the stacked capacitors 18. Additionally, the etch step used to define contact openings 16 can simultaneously be used to form the breakdown region 48. In this manner, the problem of charge accumulation and unplanned dielectric breakdown can be solved without adding unnecessary process steps or complexity.

Although the specific embodiments discussed above are directed at overcoming the problem of dielectric breakdown within stacked capacitor storage cells of a DRAM memory array during semiconductor fabrication, the present invention is not meant to be so limited. The discharge device could also be utilized to protect thin dielectric layers in other types of capacitive devices, such as trench capacitors. In fact, the present invention is directed at overcoming the problem of dielectric breakdown, during semiconductor fabrication, of any semiconductor device having an electrically isolated region of charge accumulating material.

What is claimed is:

1. A discharge device comprising:
   a semiconductor wafer having a doped region;
   a region of charge carrying material being electrically coupled to said doped region of said semiconductor wafer;
   a region of charge accumulating material being electrically isolated from said semiconductor wafer;
   a first region of insulator material being operatively coupled between said region of charge carrying material and said region of charge accumulating material, said first region of insulator material having a first electrical breakdown threshold; and
   a second region of insulator material having a breakdown region, said breakdown region having a second electrical breakdown threshold lower than said first electrical breakdown threshold and being operatively coupled between said region of charge accumulating material and said region of charge carrying material, wherein said breakdown region is formed by etching through said region of charge accumulating material and into said second region of insulator material to create an edge positioned proximate said doped region.

2. The discharge device of claim 1, wherein said breakdown region comprises an edge of said second region of insulator material positioned proximate said doped region.

3. A discharge device comprising:
   a discharge node and a memory array formed in spaced apart relation on a semiconductor substrate;
   a region of charge carrying material formed over the discharge node, the region of charge carrying material being spaced from the memory array and being electrically coupled to said discharge node;
   a first region of charge accumulating material forming a common plate of the memory array and being electrically isolated from said semiconductor substrate;
   a second region of charge accumulating material coupling the first region of charge accumulating material to the discharge node;
   a first region of insulator material being operatively coupled between said semiconductor substrate and said first region of charge accumulating material, said first region of insulator material having a first electrical breakdown threshold; and
   a second region of insulator material having a breakdown region, said breakdown region having a second electrical breakdown threshold lower than said first electrical breakdown threshold and being operatively coupled between said second region of charge accumulating material and said region of charge carrying material.

4. A discharge device comprising:
   a discharge node formed on a semiconductor substrate;
   a region of charge accumulating material being electrically isolated from said semiconductor substrate, the region of charge accumulating material having an edge positioned over the discharge node;
   a first region of insulator material being operatively coupled between said semiconductor substrate and said region of charge accumulating material, said first region of insulator material having a first electrical breakdown threshold; and
   a second region of insulator material being disposed entirely over said discharge node and abutting the edge of said region of charge accumulating material, said second region of insulator material having a second electrical breakdown threshold lower than said first electrical breakdown threshold.

5. The discharge device of claim 4, wherein said second region of insulator material is thinner than said first region of insulator material.

6. A discharge device comprising:
   a discharge node formed on a semiconductor substrate;
   a region of charge carrying material being electrically coupled to said discharge node;
   a region of charge accumulating material being electrically isolated from said region of charge carrying material, the region of charge accumulating material having an edge positioned over the discharge node;
   a first region of insulator material being operatively coupled between said region of charge carrying material and said region of charge accumulating material, said first region of insulator material having a first electrical breakdown threshold; and
   a second region of insulator material abutting the edge of said region of charge accumulating material and being disposed entirely over said discharge node on said region of charge carrying material, said second region of insulator material having a second electrical breakdown threshold lower than said first electrical breakdown threshold.

7. The discharge device of claim 6, wherein said second region of insulator material is thinner than said first region of insulator material.

8. An electronic memory device comprising:
   a plurality of memory cells, each of said plurality of memory cells having a storage capacitor, said storage capacitor having a common plate, a storage plate, and a cell dielectric disposed between said common plate and said storage plate; and a discharge device comprising:
  a doped region of a semiconductor substrate;
  a region of charge accumulating material coupled to said common plate, said common plate and said region of charge accumulating material being fabricated during the same process steps; and
  a sacrificial insulator disposed between said region of charge accumulating material and said doped region, said sacrificial insulator being constructed to break down before said cell dielectric.

9. The electronic memory device of claim 8, wherein said sacrificial insulator and said cell dielectric are fabricated during the same process steps.

10. The electronic memory device of claim 8, wherein voltage produced by an accumulated charge on said common plate breaks down said sacrificial insulator before said cell dielectric.

11. A discharge device comprising:
  a discharge node formed on a semiconductor substrate;
  a region of charge carrying material being electrically coupled to said discharge node;
  a region of charge accumulating material being electrically isolated from said semiconductor substrate;
  a first region of insulator material being operatively coupled between said region of charge carrying material and said region of charge accumulating material, said first region of insulator material having a first electrical breakdown threshold; and
  a second region of insulator material being operatively coupled between said region of charge accumulating material and said region of charge carrying material, said second region of insulator material having a second electrical breakdown threshold lower than said first electrical breakdown threshold, wherein said second region of insulator material is thinner than said first region of insulator material.

* * * * *